United States Patent
Xu et al.

(10) Patent No.: US 11,693,768 B2
(45) Date of Patent: *Jul. 4, 2023

(54) POWER LOSS DATA PROTECTION IN A MEMORY SUB-SYSTEM

(71) Applicant: MICRON TECHNOLOGY, INC., Boise, ID (US)

(72) Inventors: Peng Xu, Milpitas, CA (US); Jiangang Wu, Milpitas, CA (US); Yun Li, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/579,966

(22) Filed: Jan. 20, 2022

(65) Prior Publication Data

US 2022/0147444 A1 May 12, 2022

Related U.S. Application Data

(63) Continuation of application No. 16/726,527, filed on Dec. 24, 2019, now Pat. No. 11,256,616.

(51) Int. Cl.
| | |
|---|---|
| *G06F 12/02* | (2006.01) |
| *G06F 12/0882* | (2016.01) |
| *G11C 11/408* | (2006.01) |
| *G06F 1/3234* | (2019.01) |
| *G06F 12/0873* | (2016.01) |

(52) U.S. Cl.
CPC ........ *G06F 12/0246* (2013.01); *G06F 1/3275* (2013.01); *G06F 12/0873* (2013.01); *G06F 12/0882* (2013.01); *G11C 11/4085* (2013.01)

(58) Field of Classification Search
CPC ............ G06F 12/0246; G06F 12/0873; G06F 12/0882; G06F 1/3275; G11C 11/4085
See application file for complete search history.

(56) References Cited

U.S. PATENT DOCUMENTS

| | | | | |
|---|---|---|---|---|
| 2011/0022778 A1* | 1/2011 | Schibilla | ............. | G06F 12/0246 711/170 |
| 2012/0173797 A1* | 7/2012 | Shen | .................... | G06F 12/0246 711/E12.008 |
| 2020/0043549 A1* | 2/2020 | Shibata | .................. | G11C 16/32 |
| 2020/0210335 A1* | 7/2020 | Sundrani | ............. | G06F 12/0246 |

OTHER PUBLICATIONS

Huang, Lan, and Tzi-cker Chiueh. "Trail: Track-based logging in Stony Brook Linux." Proceedings of International Conference on Dependable Systems and Networks. 2002. (Year: 2002).*

\* cited by examiner

*Primary Examiner* — Nicholas J Simonetti
(74) *Attorney, Agent, or Firm* — Lowenstein Sandler LLP

(57) ABSTRACT

A media management operation is executed to write data from a source block of a cache memory to a set of pages of a destination block of a storage area of a memory sub-system. An entry of a data structure identifying a page count corresponding to the source block of the cache memory is generated. A power loss event associated with the destination block of the storage area is identified. A data recovery operation is executed using the data stored in the source block to complete the write to the destination block. The data is erased from the source block in response to the page count satisfying a condition.

20 Claims, 6 Drawing Sheets

FIG. 3

| SOURCE BLOCK DATA STRUCTURE (FIRST DATA STRUCTURE) 300 | | |
|---|---|---|
| SOURCE BLOCK IDENTIFIER | PAGE COUNT FROM SOURCE BLOCK | PROGRAM ERROR COUNT (PEC) |
| SOURCE BLOCK 0 | PAGE COUNT FROM SOURCE BLOCK 0 | BLOCK 0 PEC |
| SOURCE BLOCK 1 | PAGE COUNT FROM SOURCE BLOCK 1 | BLOCK 1 PEC |
| SOURCE BLOCK 2 | PAGE COUNT FROM SOURCE BLOCK 2 | BLOCK 2 PEC |
| SOURCE BLOCK 3 | PAGE COUNT FROM SOURCE BLOCK 3 | BLOCK 3 PEC |
| SOURCE BLOCK 4 | PAGE COUNT FROM SOURCE BLOCK 4 | BLOCK 4 PEC |
| SOURCE BLOCK 3 | PAGE COUNT FROM SOURCE BLOCK 3 | BLOCK 3 PEC + 1 |

POWER LOSS DATA PROTECTION IN A MEMORY SUB-SYSTEM

CROSS-REFERENCE TO RELATED APPLICATION

This application is a continuation of U.S. patent application Ser. No. 16/726,527, filed on Dec. 24, 2019, the entirety of which is hereby incorporated by reference herein.

TECHNICAL FIELD

Embodiments of the disclosure relate generally to memory sub-systems, and more specifically, relate to power loss data protection in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates an example source block data structure managed by a data protection component of a memory sub-system in accordance with some embodiments.

DETAILED DESCRIPTION

Figure 1:
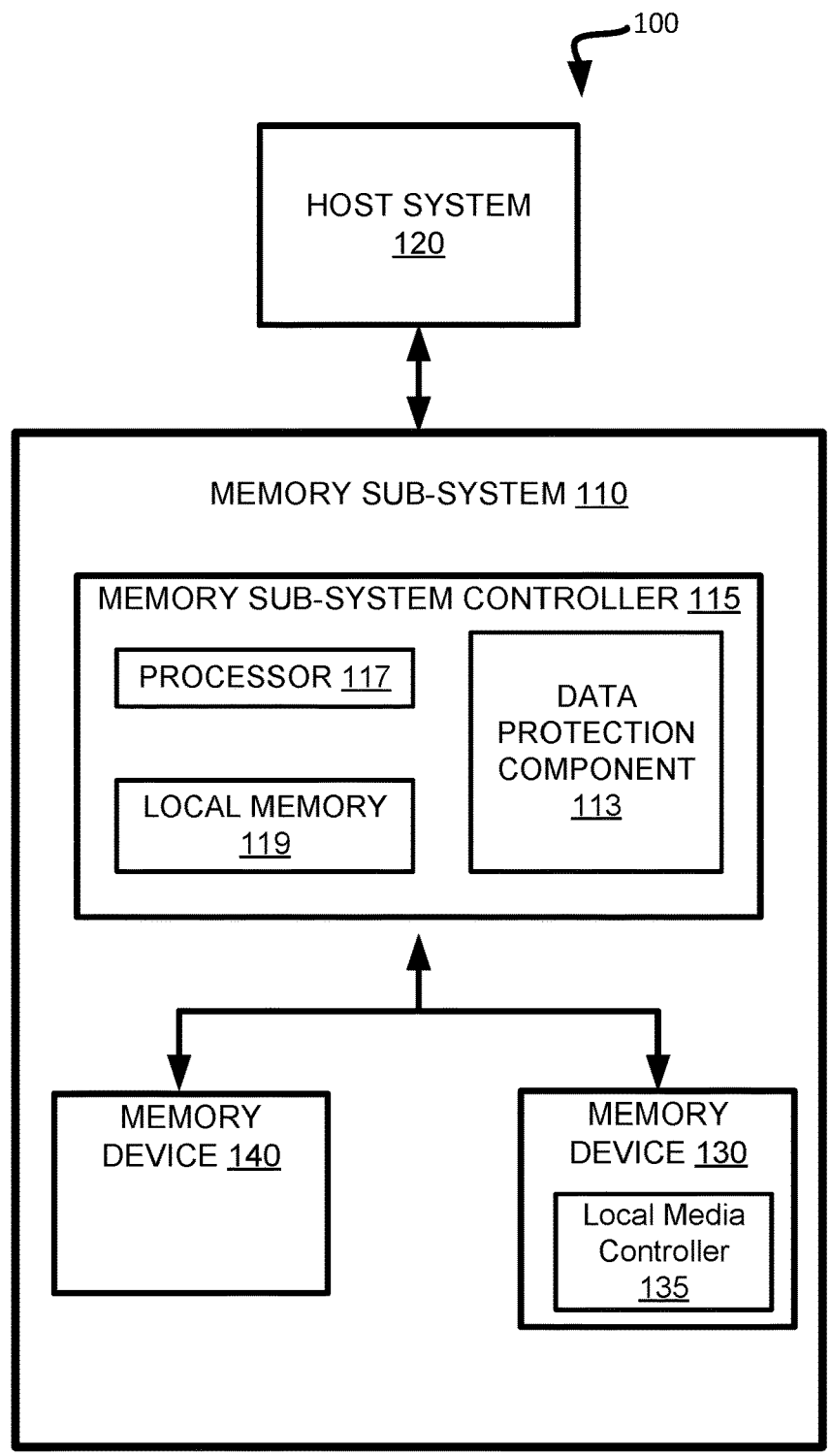
FIG. 1 illustrates an example computing system that includes a memory sub-system in accordance with some embodiments of the present disclosure.

Aspects of the present disclosure are directed to data loss power protection in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include multiple memory components having one or more arrays of memory cells such as low density storage having single level cells (SLCs) or high density storage having multi-level cells (MLCs), triple level cells (TLCs) or quad-level cells (QLCs). The host system can write data to a low density storage location (e.g., SLC cache) of the memory sub-system which includes multiple reserved data blocks typically configured to store host data on a first-in, first-out basis. Conventionally, a garbage collection operation can be performed to relocate all of the host data stored in the SLC cache to high density bulk storage, referred to as an XLC (e.g., MLC/TLC/QLC) storage area (e.g., having a 256 GB storage size). The garbage collection operation includes a process of relocating data from one or more source data blocks (e.g., the static SLC cache) into one or more destination data blocks (e.g., the XLC storage), with the intended purpose of data consolidation to free up storage resources of the static SLC cache for subsequent erase and new write processing. During execution of the garbage collection operation, the host data can be copied from one or more NAND locations corresponding to the SLC cache to another NAND location corresponding to the higher density storage area (e.g., XLC storage). During this process, a wordline (e.g., a portion of the memory cell of the higher density storage) is programmed with the data. Each wordline (also referred to as a "memory cell portion") contains multiple sub-blocks containing multiple pages (e.g., lower pages (LP), upper pages (UP), and extra pages (XP)), with one or more lower and upper pages coupled to one another. A wordline is not fully programmed until all of the pages of the wordline have been programmed. As such, if a power loss is experienced during upper page or extra page programming, the coupled lower and upper pages on the wordline can be corrupted, resulting in a loss of data. Conventionally, to address instances of power loss during wordline programming, a capacitor is employed to store and provide additional power to enable a last program operation associated with a wordline to be completed. This, however, results in additional hardware and associated device cost. In addition, the use of a capacitor to manage power loss issues reduces the reliability of the memory sub-system due to life cycle problems and limitations associated with the capacitor.

Aspects of the present disclosure address the above and other deficiencies by having a memory sub-system that implements and manages data structures to enable recovery of data using data stored in a source block of cache memory of a memory component in the event of a power loss event during programming of a memory cell portion (e.g., a wordline). During the programming of data written by a host system into the memory component, the data is stored into one more source blocks (e.g., SLC blocks of the cache memory). A memory sub-system memory controller maintains a data structure including mapping information between a range of logical addresses corresponding to logical blocks of a memory device and an address of the source block in the cache memory (also referred to as a "source block address") of physical addresses of memory cells of the memory device (also referred to as a "logical-to-physical (L2P) mapping data structure").

When the cache memory reaches capacity (e.g., is full), a media management operation (e.g., a recycling or garbage collection process) is initiated to move the data from the cache memory to a destination block of a higher density storage area (e.g., an XLC block, such as a TLC block or an MLC block) of the memory sub-system. A memory controller determines that the entire wordline is programmed (e.g., all of the pages of the wordline) before erasing the source block from the data cache. In addition, the memory controller delays an update of the L2P mapping data structure with updated source block address information until following the determination that the entire wordline has been programmed.

Advantageously, instead of updating the cache memory (i.e., erasing the data from the source block in the cache memory) and the L2P mapping data structure (i.e., updating the source block address information) after a page programming operation is complete, the memory controller delays the updates until after determining that entire wordline is "safe" (i.e., all of the pages of the destination block of the high density storage (e.g., TLC blocks) have been programmed). Beneficially, this results in protection against data corruption and loss due to an asynchronous power loss event occurring during programming of the destination block. Furthermore, following a power loss event, a power on rebuild process can be performed to recover data from the preserved (i.e., not erased) source blocks (e.g., the SLC blocks) to complete an interrupted program operation and properly store the data in the destination blocks (e.g. the TLC blocks). This rebuild from the cache memory can be performed without risk of the source block data being erased prior to fully programming the destination block. Advantages of the present disclosure further include, but are not limited to, achieving protection against destination block data loss by avoiding the use of an additional power-loss capacitor to provide stored power to complete a program operation in the event of a power loss, as used in conventional systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, media management operations such as garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a data protection component 113 that can be used to manage data written by the host system 120 during a media management operation (e.g., a garbage collection or recycling process) where the data is written from a source block of cache memory of a memory sub-system (e.g., an SLC block) to a destination block of a high density storage area of the memory sub-system (e.g., a TLC block). The data protection component 113 also manages a data structure including mapping information associating logical addresses and physical addresses of the source blocks (also referred to as source block address) of a memory sub-system (also referred to as an "L2P mapping data structure"). The data protection component 113 determines that a portion of the memory cells of the destination block (e.g., all pages of a wordline) have been written during a garbage collection operation prior to erasing the written data from the source block of the cache memory. In so doing, the data protection component 113 enables a data recovery process to be performed using the data of the preserved source block in the event of a power loss event occurring prior to fully programming the portion of the memory cell. The data protection component 113 further delays updating of the L2P mapping data structure with a new source block address until after determining that the portion of the memory cell has been fully programmed as part of the media management operation (e.g., a garbage collection operation). In some embodiments, the memory sub-system controller 115 includes at least a portion of the data protection component 113. For example, the memory sub-system controller 115 can include a processor 117 (processing device) configured to execute instructions stored in local memory 119 for performing the operations described herein. In some embodiments, the data protection component 113 is part of the host system 120, an application, or an operating system. In the same or alternative embodiments, portions of the data protection component 113 are part of the host system 120 while other portions of the data protection component 113 are performed at the memory sub-system controller 115.

Figure 2:
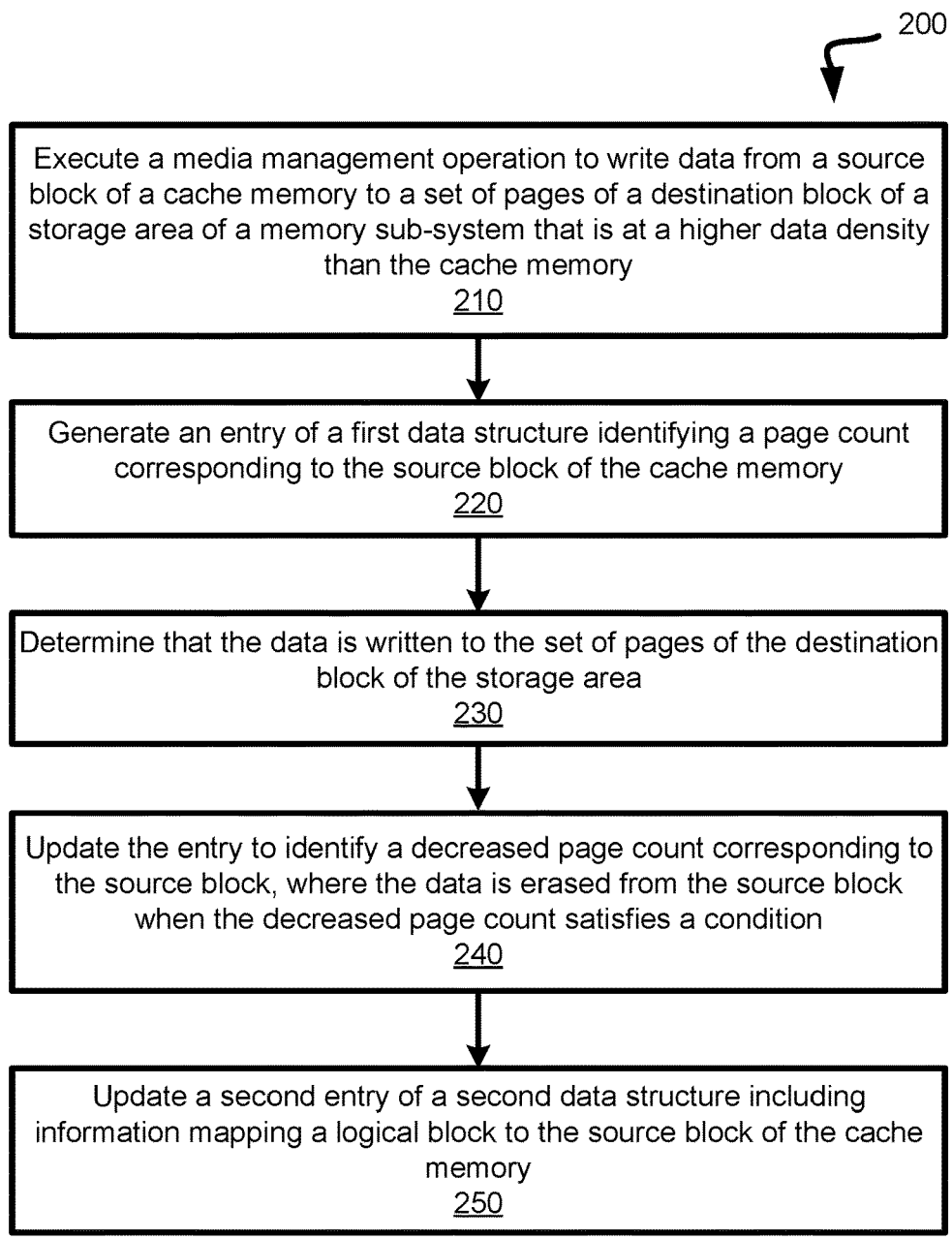
FIG. 2 is a flow diagram of an example method to manage a data structures in connection with a garbage collection operation relating to a memory sub-system in accordance with some embodiments.

FIG. 2 is a flow diagram of an example method 200 to manage data stored in a source block and one or more entries of an L2P mapping data structure in connection with a media management operation (e.g., a garbage collection operation) in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the data protection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic executes a media management operation to write data from a source block of a cache memory to a set of pages of a destination block of a storage area of a memory sub-system that is at a higher density than the cache memory. In an embodiment, the source block can be an SLC block and the higher density storage area of the memory sub-system can be a TLC block. In an embodiment, the source block can be a one-bit memory that does not have coupling between multiple pages of a portion of the memory cell (e.g., a wordline). In an embodiment, the media management operation includes a garbage collection or recycling process that can be initiated in response to a determination that the cache memory is reaching a capacity or a threshold level. In an embodiment, in response to determining the page of the destination block being written to is an LP/UP page, the physical-to-logical (P2L) page can be updated and, if the P2L page is full, the data stored in the source blocks of the cache memory can be written to the destination block (i.e., the media management process can be initiated and executed, including sending the recycle write request to the backend of the memory sub-system).

At operation 220, the processing logic generates an entry of a first data structure identifying a page count corresponding to the source block of the cache memory. In an embodiment, the first data structure includes information relating to the source blocks of the cache memory. For example, the first data structure can include a table including one or more entries relating to the source blocks of the cache that can be used to manage the host write data and media management processing (e.g., garbage collection processing). The first data structure can include entries identifying a source block number, a first value counter such as a page count (e.g., a number of pages that are to be moved or written from the source block to the destination block), and a second value counter, such as a program erase count (PEC) (e.g., a version identifier). In an embodiment, the entry is generated to include a source block number corresponding to the source block storing the host written data, a page count associated with the source block, and a program erase count. An example of the first data structure 300 is shown in FIG. 3. As shown in FIG. 3, entries can be maintained and updated relating to multiple source blocks of the cache memory (e.g., multiple SLC blocks storing host written data to be moved or written to destination blocks of the memory sub-system). In an embodiment, the entry associated with the source block can include a current PEC in the first data structure (e.g., the source block table) to indicate that the source block is not to be released and re-used. In an embodiment, each entry can include a count value corresponding to the page count from source block. In an embodiment the source block page count is decreased for each page that is programmed to the destination block and when the source block page count satisfies a condition (e.g., equals zero), the current source block is safe to erase, and a switch can be performed to the next source block in the source block data structure 300.

In operation 230, the processing logic determines that the data is written to the set of pages of the destination block of the storage area. In an embodiment, the determination that the data has been written to all of the pages (e.g., the set of pages) indicates that the write operation for the portion of the memory cell (e.g., the entire wordline) is complete. In an embodiment, the processing device can determine that the data has been written to all of the pages of the destination block by determining the programming of the last extra page (XP) of the wordline is complete, indicating that the wordline is safe.

In operation 240, the processing logic updates the entry to identify a decreased page count corresponding to the source block, where the data is erased from the source block when the decreased page count satisfies a condition. In an embodiment, the condition is satisfied when the page count associated with the source block equals zero. In an embodiment, upon determining the page count satisfies the condition (e.g., the page count equals zero), the processing logic can release the source block and erase the data in view of the confirmation that the wordline is safe. In an embodiment, the processing logic maintains the data in the source block (i.e., does not erase the data) until after the determination that the wordline is safe (i.e., in operation 230).

In operation 250, the processing logic updates a second entry of a second data structure including information mapping a logical block to the source block of the cache memory. In an embodiment, the second data structure is an L2P mapping data structure including an entry (also referred to as the "second entry") which maps a logical block to an address of the source block of the cache memory. In an embodiment, in contrast to conventional systems, the previous mapping (e.g., the logical block address to the physical block address of the source block) is maintained in the L2P mapping data structure (e.g., a table) until after the determination that the entire wordline is safe, in operation 230. Advantageously, if a power loss event occurs prior to operation 230, a data recovery operation can be executed to recover the data written to the destination block using the data preserved (i.e., not erased) in the source block and the L2P mapping information preserved in the L2P mapping data structure. In an embodiment, the data is protected from corruption during the garbage collection process (e.g., writing the data from the source block to the destination block) by determining the data on the destination block is safe before erasing the data on the source block. In an embodiment, by preserving the data on the source block until the destination block is fully programmed, a power on rebuild process can be performed to recover the data in response to a power loss event occurring during the garbage collection processing.

Figure 4:
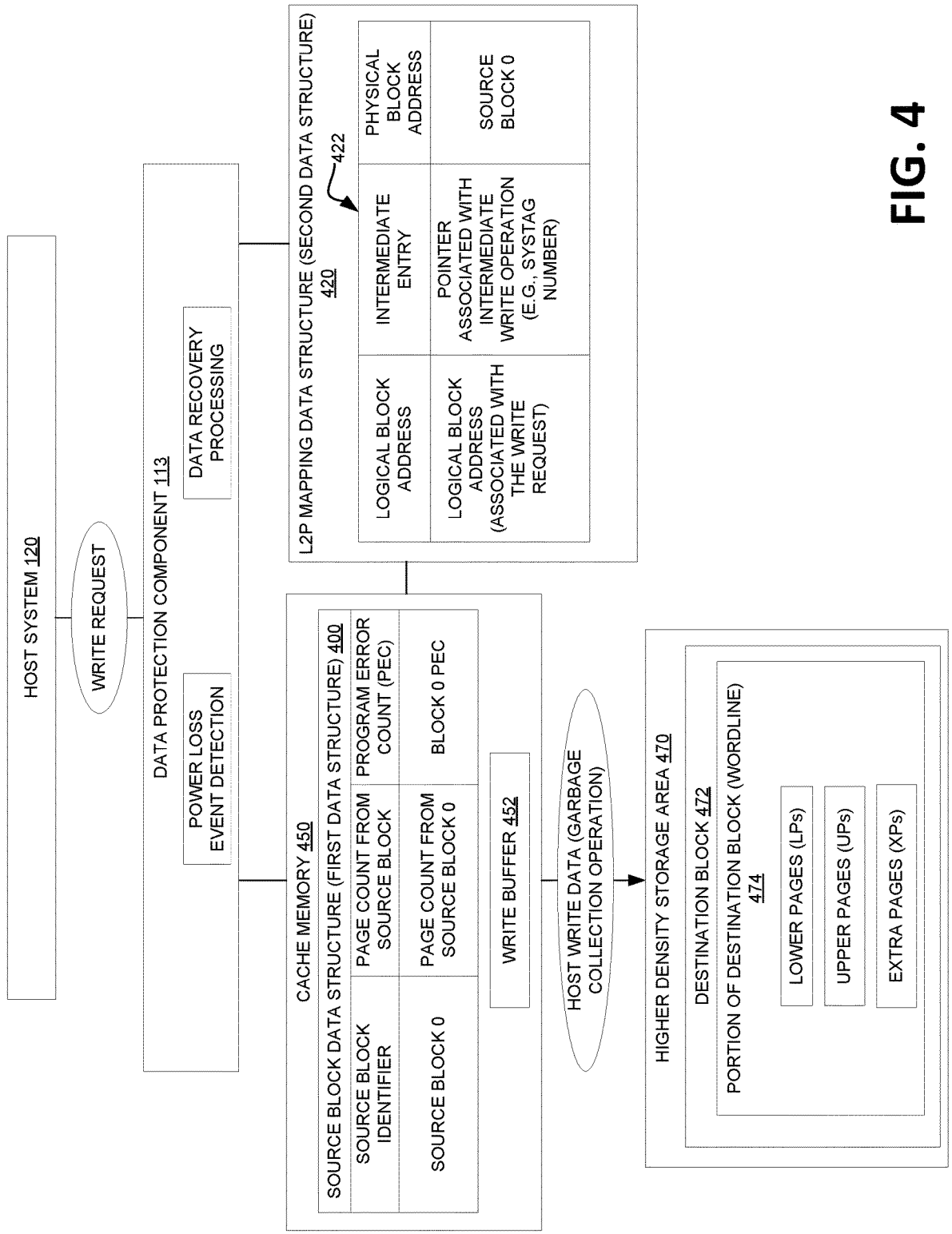
FIG. 4 illustrates an example data protection component managing data structures in connection with a garbage collection operation in accordance with some embodiments.

FIG. 4 illustrates an example first data structure 400 (i.e., a source block data structure) and a second data structure 420 (i.e., an L2P mapping data structure) managed by a data protection component 113 in accordance with embodiments.

As shown in FIG. 4, the data protection component 113 is configured to receive a write request from a host system 120. The write request includes instructions to perform a write operation to program data to a physical destination block 472 of a higher density storage area 470 physical page of a memory sub-system. The write request identifies a logical block address associated with one or more logical blocks of the memory sub-system. The data protection component 113 employs the data structure 420 to translate the logical block address to a corresponding source block address (e.g., source block 0 in FIG. 4). The first data structure 400 is maintained in a cache memory 450 (e.g., SLC storage) and includes information associated with the one or more source blocks. A garbage collection process can be performed to write the host data from the source block to the destination block 472 of the higher density storage area 470 (e.g., TLC storage).

In an embodiment, the source block data structure 400 can be used to record the source block number and program error count (PEC) during the garbage collection processing. In an embodiment, if the logical block is re-written during the garbage collection processing, the source block number in the L2P mapping data structure 420 is changes so that the source block number and PEC does not match the source block number and PEC stored in the source block data structure 400. In an embodiment, the page count from the source block is used to correlate the physical-to-logical (P2L) mapping information In an embodiment, the L2P mapping data structure 420 can include standard entries and intermediate entries. The standard entries can relate to memory locations that are not involved in an in-process or ongoing write request. The standard entries (also referred to as "standard L2P entries") can include map translation information relating to a logical address to a physical address of the source block, including a logical block address header, a plan number of the logical block address header, a logical unit number (LUN), and physical block address information (e.g., page and block identifiers).

An intermediate entry is an entry in an L2P mapping data structure that identifies an address of the write buffer storing data associated with the intermediate or in-process write operation during its pendency of the write operation (e.g., before the write operation has been completed and the corresponding data has been written to the destination physical location of the memory sub-system. In an embodiment, the intermediate entry includes a pointer (e.g., a tag or other identifier including address corresponding to a write buffer 452 storing data associated with the intermediate write operation). In an embodiment, the pointer may include a system managed tag (also referred to as a "systag") having one or more additional bits that can be used to store information identifying the intermediate write operation. In an embodiment, the pointer identifies a write buffer address in cache storing the data associated with the intermediate write operation.

In an embodiment, upon receipt of the write request, the processing logic can check if the corresponding entry in the L2P mapping data structure is a standard entry or an intermediate entry (i.e., associated with an intermediate write operation). In an embodiment, the processing logic can identify the entry corresponding to the write request is a standard entry, generate the intermediate entry, and store the intermediate entry in the data structure. In an embodiment, the processing logic can identify the entry corresponding to the write request is an intermediate entry (e.g., the entry relates to another intermediate write operation), the processing logic can replace the pointer of the current intermediate entry with updated pointer associated with the write request received.

In an embodiment, the data protection component 113 to monitor an intermediate write operation corresponding to the write request during the pendency of the write operation, the intermediate entry 422 in the data structure 420. In an embodiment, the intermediate entry 422 can include a pointer or other identifier identifying an address in cache 450 of a write buffer 452 associated with the intermediate write operation. In an embodiment, the pointer is a system managed tag (or "systag") number including one or more bits to identify the location of the write buffer including data associated with the intermediate write operation.

In an embodiment, the physical block address entry stored in the data structure 420 can identify the physical block address is "pending" to signal to the data protection component 413 that the data has not yet been written to the physical memory device of the memory sub-system. As shown in FIG. 4, a pointer table (or other data structure) can be stored in the cache 450 and include pointer information associated with each intermediate write operation. In an embodiment, if, upon completion of the write operation, the data protection component 113 determines the pointer stored in the intermediate entry 422 does not match the pointer information stored in the pointer table, the data protection component 113 determines the logical block has been overwritten.

In an embodiment, the data protection component 113 delays updating the source block data structure 400 and the L2P mapping data structure 420 until after the programming of the entire portion of the destination block (e.g., the lower pages, upper pages, and extra pages of a wordline) 474 is completed. In an embodiment, the data protection component 113 preserves the data in the source block data structure 400 and the L2P mapping data structure 420 to enable data recovery processing in the event of a power loss event occurring while the garbage collection process is on-going, but not yet completed (e.g., during the UP/XP programming).

Figure 5:
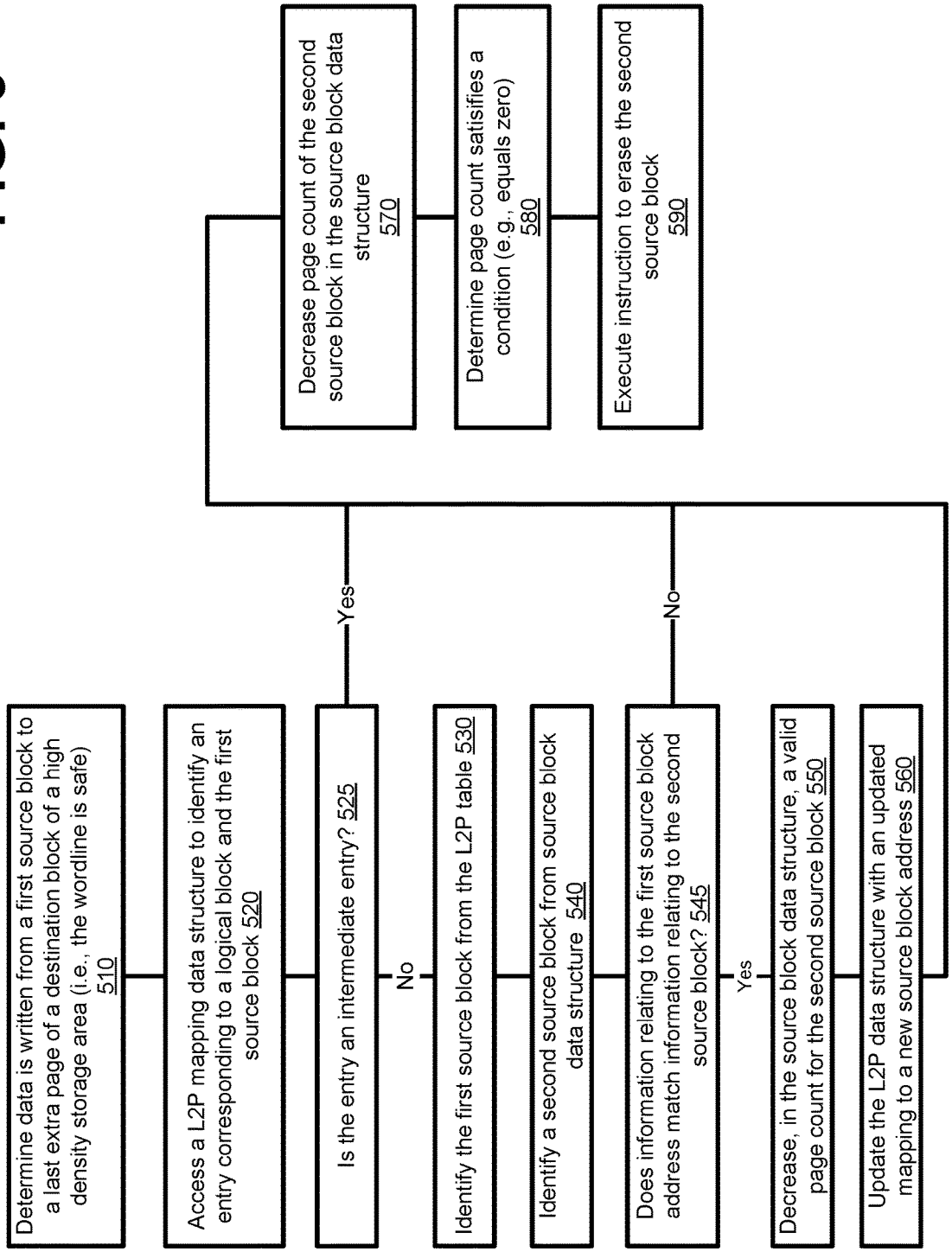
FIG. 5 is a flow diagram of an example method to manage data structures in connection with a garbage collection operation relating to a memory sub-system in accordance with some embodiments.

FIG. 5 is a flow diagram of an example method 500 to manage data structures in connection with a host write operation and a garbage collection operation to preserve data for execution of a data recovery process in response to a power loss event occurring during the garbage collection operation in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the data protection component 113 of FIG. 1. In an embodiment, the operations of method 500 can be performed in connection with operation 230 of FIG. 2. In an embodiment, the method 500 relates to the management of the source block data structure and L2P mapping data structure in connection with the execution of a garbage collection operation to move or write host write data from a source block of cache memory (e.g., a SLC block) to a portion (e.g., all pages of a wordline) of a destination block of a high density storage area of a memory sub-system (e.g., a TLC block). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, the processing logic determines the data (e.g., the data written by the host to the memory sub-system) is written from a first source block to a last extra page of the destination block of a high density storage area. In an embodiment, the determination that the last extra page of the destination block indicates that all of the pages of a wordline have been programmed and the wordline is "safe". In an embodiment, the data is written from the first source block to the destination block as part of an executed garbage collection operation.

In operation 520, the processing logic accesses a L2P mapping data structure to identify an entry corresponding to a logical block and the first source block. In operation 525, the processing logic determines whether the entry is an intermediate entry (e.g., relates to an intermediate or on-going write operation). If the entry is an intermediate entry, the process 500 continues to operation 570, as described in greater detail below. If the entry is a standard entry, the process continues to operation 530.

In operation 530, the processing logic identifies the first source block from the L2P table. In operation 540, the processing logic identifies a second source block from a source block data structure. In an embodiment, the source block data structure (e.g., example source block data structures shown in FIG. 3 and FIG. 4) includes entries relating to the source blocks of a cache memory.

In operation 545, the processing logic determines whether information relating to the first source block and the second source block address match. If the first source block information and the second source block information do not match, the method 500 proceeds to operation 570. In an embodiment, if a block number of the first source block does not match a block number of the second source block, the processing logic determines that the L2P mapping changed before the wordline was confirmed to be "safe", and the processing logic drops or removes a "pending" status of the mapping. In an embodiment, if the block number of the first source block and the block number of the second source block match, but the PEC does not match, the processing logic determines that the logical block has been re-written and the first source block has been re-used with a mapping to the same logical block. In an embodiment, the processing logic increases the PEC and drops the pending mapping to the previous source block.

In operation 545, the processing logic can determine the mapping is valid by determining the block number and PEC of the first source block stored in the L2P mapping data structure matches the block number and PEC of the second source block stored in the source block data structure, the method 500 proceeds to operation 550. In operation 550, the processing logic decreases, in the source block data structure, a valid page count the second source block. In operation, the processing logic updates the L2P mapping data structure with an updated mapping to a new source block. In an embodiment, the processing logic can increase a valid page count number associated with the new source block.

In operation 570, the processing logic decreases a page count of the second source block in the source block data structure. In operation 580, the processing logic can check to determine whether the page count of the second source block satisfies a condition. In an embodiment, the condition is satisfied when the page count reaches or equals zero, indicating the second source block is safe to erase.

In operation 590, the processing logic executes an instruction to erase the second source block. In an embodiment, by erasing the data of the second source block (e.g., from the cache memory of the memory sub-system) at this stage of the method 500 (e.g., after determining the wordline is closed and safe), the processing logic preserves the data in the second source block in the event a data recovery operation is to be performed in response to a power loss event occurring during the garbage collection operation (e.g., at a point prior to writing the data from the second source block to all of the pages of the wordline of the destination block).

Figure 6:
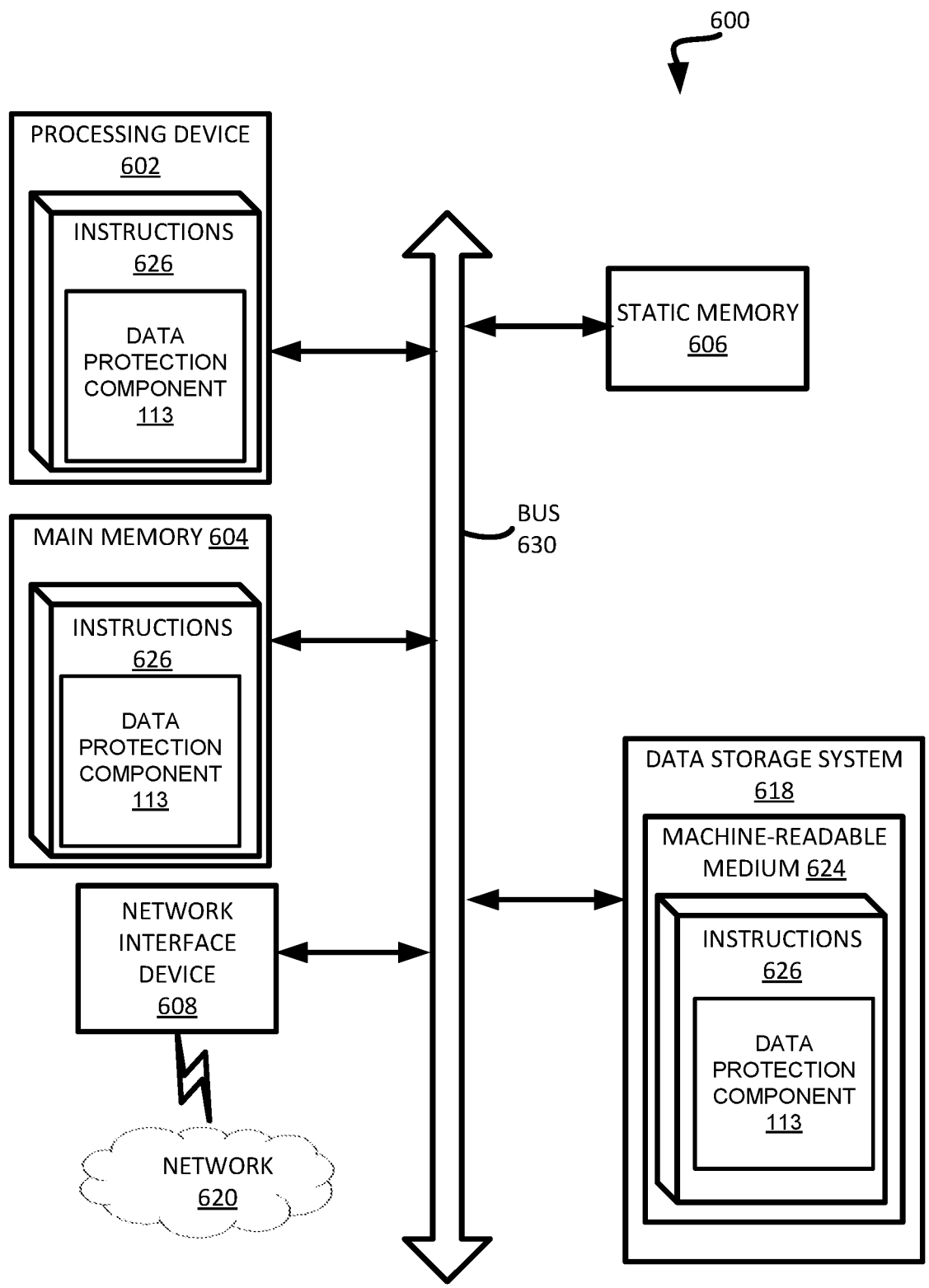
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a data protection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data protection component (e.g., the data protection component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
executing, by a processing device, a media management operation to write data from a source block of a cache memory to a set of pages of a destination block of a storage area of a memory sub-system;
generating an entry of a data structure identifying a page count corresponding to the source block of the cache memory;
identifying a power loss event associated with the destination block of the storage area;
executing a data recovery operation using the data stored in the source block to resume the media management operation to complete the write of the data to the destination block; and
erasing the data from the source block in response to the page count satisfying a condition.

2. The method of claim 1, wherein the power loss event occurs during execution of the media management operation to write the data to the destination block.

3. The method of claim 1, wherein the data recovery operation is executed as part of a power on rebuild process to recover the data stored in the source block.

4. The method of claim 1, wherein the data structure comprises a source block list comprising information identifying a plurality of source blocks used to store the data to be written to one or more destination blocks as part of the media management operation.

5. The method of claim 1, further comprising storing an additional data structure comprising information mapping a logical block to the source block of the cache memory.

6. The method of claim 5, wherein the additional data structure comprises a logical-to-physical (L2P) block address mapping comprising the information mapping a logical block address to the source block of the cache memory.

7. The method of claim 1, further comprising updating the data structure to comprise a decreased page count corresponding to the source block.

8. A non-transitory computer readable medium comprising instructions, which when executed by a processing device, cause the processing device to perform operations comprising:

执行 executing a media management operation to write data from a source block of a cache memory to a set of pages of a destination block of a storage area of a memory sub-system;

generating an entry of a data structure identifying a page count corresponding to the source block of the cache memory;

identifying a power loss event associated with the destination block of the storage area;

executing a data recovery operation using the data stored in the source block to resume the media management operation to complete the write of the data to the destination block; and erasing the data from the source block in response to the page count satisfying a condition.

9. The non-transitory computer readable medium of claim 8, wherein the power loss event occurs during execution of the media management operation to write the data to the destination block.

10. The non-transitory computer readable medium of claim 8, wherein the data recovery operation is executed as part of a power on rebuild process to recover the data stored in the source block.

11. The non-transitory computer readable medium of claim 8, wherein the data structure comprises a source block list comprising information identifying a plurality of source blocks used to store the data to be written to one or more destination blocks as part of the media management operation.

12. The non-transitory computer readable medium of claim 8, the operations further comprising storing an additional data structure comprising information mapping a logical block to the source block of the cache memory.

13. The non-transitory computer readable medium of claim 12, wherein the additional data structure comprises a logical-to-physical (L2P) block address mapping comprising the information mapping a logical block address to the source block of the cache memory.

14. The non-transitory computer readable medium of claim 8, the operations further comprising updating the data structure to comprise a decreased page count corresponding to the source block.

15. A system comprising:
a memory device; and
a processing device, operatively coupled with the memory device, to perform operations comprising:

executing a media management operation to write data from a source block of a cache memory to a set of pages of a destination block of a storage area of a memory sub-system;

generating an entry of a data structure identifying a page count corresponding to the source block of the cache memory;

identifying a power loss event associated with the destination block of the storage area;

executing a data recovery operation using the data stored in the source block to resume the media management operation to complete the write of the data to the destination block; and erasing the data from the source block in response to the page count satisfying a condition.

16. The system of claim 15, wherein the power loss event occurs during execution of the media management operation to write the data to the destination block.

17. The system of claim 15, wherein the data recovery operation is executed as part of a power on rebuild process to recover the data stored in the source block.

18. The system of claim 15, wherein the data structure comprises a source block list comprising information identifying a plurality of source blocks used to store the data to be written to one or more destination blocks as part of the media management operation.

19. The system of claim 15, the operations further comprising storing an additional data structure comprising information mapping a logical block to the source block of the cache memory.

20. The system of claim 15, the operations further comprising updating the data structure to comprise a decreased page count corresponding to the source block.

* * * * *